United States Patent
Lee et al.

(10) Patent No.: US 6,432,820 B1
(45) Date of Patent: Aug. 13, 2002

(54) METHOD OF SELECTIVELY DEPOSITING A METAL LAYER IN AN OPENING IN A DIELECTRIC LAYER BY FORMING A METAL-DEPOSITION-PREVENTION LAYER AROUND THE OPENING OF THE DIELECTRIC LAYER

(75) Inventors: Myoung-bum Lee, Seoul; Jong-myeong Lee, Sungnam; Byung-hee Kim, Seoul; Gil-heyun Choi, Sungnam, all of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/921,165

(22) Filed: Aug. 2, 2001

(30) Foreign Application Priority Data

Mar. 21, 2001 (KR) .............................. 01-14591

(51) Int. Cl.$^7$ .............................................. H01L 21/44
(52) U.S. Cl. ...................................... 438/677; 438/688
(58) Field of Search .............................. 438/677, 674, 438/675, 676, 688

(56) References Cited

U.S. PATENT DOCUMENTS

| | | | | |
|---|---|---|---|---|
| 4,902,533 A | * | 2/1990 | White et al. | 427/255.392 |
| 4,963,511 A | * | 10/1990 | Smith | 148/DIG. 19 |
| 5,312,773 A | * | 5/1994 | Nagashima | 257/763 |
| 5,589,425 A | * | 12/1996 | Hoshino et al. | 427/124 |
| 5,604,153 A | * | 2/1997 | Tsubouchi et al. | 438/676 |
| 6,133,147 A | * | 10/2000 | Rhee et al. | 427/282 |
| 6,245,655 B1 | * | 6/2001 | Moslehi | 438/612 |
| 2002/0030210 A1 | * | 3/2002 | Matsui et al. | 257/296 |

FOREIGN PATENT DOCUMENTS

| | | | | |
|---|---|---|---|---|
| EP | 0 831 523 A2 | * | 9/1996 | H01L/21/3205 |
| JP | 05343356 A | * | 12/1993 | H01L/21/28 |

* cited by examiner

*Primary Examiner*—Olik Chaudhuri
*Assistant Examiner*—Erik Kielin
(74) *Attorney, Agent, or Firm*—Mills & Onello, LLP

(57) ABSTRACT

A method is provided for forming a metal wiring layer of a semiconductor device, which is performed in an airtight space, the pressure of which is maintained below atmospheric pressure, to form a metal deposition prevention layer. An interlayer dielectric layer pattern is formed on a semiconductor substrate so as to define a hole region. A metal film is formed on the top surface of the interlayer dielectric layer pattern under a vacuum state so as to expose the side walls of the hole region. The metal layer is oxidized in the airtight space, the pressure of which is maintained below atmospheric pressure in an oxygen atmosphere, thereby forming a metal deposition prevention layer. A metal liner is selectively formed at the side walls of the hole region. A metal layer is formed inside the hole region defined by the metal liner and on the metal deposition prevention layer. The metal liner is heat-treated and reflowed.

33 Claims, 4 Drawing Sheets

METHOD OF SELECTIVELY DEPOSITING A METAL LAYER IN AN OPENING IN A DIELECTRIC LAYER BY FORMING A METAL-DEPOSITION-PREVENTION LAYER AROUND THE OPENING OF THE DIELECTRIC LAYER

BACKGROUND OF THE INVENTION

1. Field of the Invention

The present invention relates to a method for manufacturing a semiconductor integrated circuit, and more particularly, to a method for forming a metal wiring layer.

2. Description of the Related Art

As the integration density of semiconductor devices increases, it becomes necessary to introduce metal wiring layers having a multilayered wiring structure into the semiconductor circuits. Since metal wiring layers transmit electrical signals, it is necessary to use a material for the metal wiring layers, that has low electrical resistance and high reliability, and is economical. To meet these demands, aluminum is widely is used as the material of the metal wiring layers.

However, as line width of a circuit decreases, there are technical limits in applying conventional deposition techniques to form a metal wiring layer in a process for manufacturing a semiconductor device. Thus, a technique of burying either a contact hole connecting a lower conductive layer to an upper aluminum wiring layer or a via hole connecting a lower aluminum wiring layer to an upper aluminum wiring layer, by using a wiring material is considered to be very important to electrically interconnect the layers to each other.

To obtain superior electrical properties and burying characteristics when burying the contact hole or via hole (hereinafter, only the contact hole will be mentioned) with aluminum, a variety of processing techniques have been developed. In a deposition process for forming a metal wiring layer in the manufacture of a next generation memory device, in which the line width of a circuit is no greater than 0.25 $\mu$m, the aspect ratio of a contact hole is high, and thus it is quite improper to completely rely on a physical vapor deposition (PVD) process, such as sputtering. To overcome the problem of high aspect ratio of a contact hole, various studies have been conducted on processes for forming the aluminum wiring layer using a chemical vapor deposition (CVD) method, especially, a preferential metal deposition (PMD) method, which has superior step coverage characteristics, as compared to the PVD method, in which an aluminum film is formed within a contact hole using a CVD method and is deposited outside the contact hole using a PVD method. In the PMD method, to selectively form an aluminum film within a contact hole, a metal deposition prevention layer is formed on an interlayer dielectric layer pattern which defines the contact hole, thereby exposing only the inside of the contact hole, and then the aluminum film is formed within the contact hole using a CVD method.

In a conventional PMD method, to form the metal deposition prevention layer, a predetermined metal layer is formed on the interlayer dielectric layer pattern and then is exposed to atmosphere, thereby oxidizing the metal layer. The metal deposition prevention layer obtained by exposing the metal layer to atmosphere and inducing the generation of a natural aluminum oxide layer is used as an anti-nucleation layer for preventing deposition of the aluminum film introduced by a subsequent CVD process.

However, as described above, in the conventional PMD process, the metal layer is exposed to the atmosphere to generate a natural aluminum oxide layer, and thus the degree to which the natural aluminum oxide layer is formed varies depending on the exposure time. In other words, in the case of exposing the aluminum film after forming aluminum on the interlayer dielectric layer pattern, if the aluminum film is exposed to the atmosphere for a long time, the inside of the contact hole may be affected by natural oxidization. As a result, in the case of forming the aluminum film within the contact hole using a CVD method, the aluminum film may be not perfectly deposited at upper side walls of the contact hole near the entrance of the contact hole.

In addition, to obtain an oxide layer that is capable of sufficiently preventing metal deposition by taking advantage of a natural oxidation phenomenon, at least 2 hours of oxidation time is required. To perform a natural oxidation process introduced by exposing a metal layer to the atmosphere in the case of performing a metal wiring layer formation process using a cluster tool type equipment, a wafer should be taken out from the cluster tool type equipment in order to expose the wafer to the atmosphere and then returned into the equipment. At this time, it is impossible to maintain the original vacuum state of the equipment. To create a desired vacuum state again, a predetermined amount of time is necessary to exhaust the equipment of air. Therefore, a problem may arise in that the throughput of the process may be considerably lowered.

Also, in the case of forming the metal deposition prevention layer by taking advantage of the natural oxidation phenomenon introduced by exposure of a metal layer to the atmosphere, it is impossible to numerically control the process of forming a natural oxide layer, and thus it is difficult to ensure the reproducibility of the process. In addition, during the exposure of a metal layer to the atmosphere, the metal layer may be contaminated by unnecessary particles or a critical defect may occur. These problems may directly decrease the yield of semiconductor devices to be manufactured.

SUMMARY OF THE INVENTION

To address the above limitations, it is an object of the present invention to provide a method for forming a metal wiring layer of a semiconductor device, which is capable of ensuring the reproducibility of a process, preventing contamination caused by particles or occurrence of defects, and enhancing the throughput of the process.

Accordingly, to achieve the above object, there is provided a method for forming a metal wiring layer according to a first aspect of the present invention. An interlayer dielectric layer pattern defining a hole region is formed on a semiconductor substrate. A metal film is formed on the top surface of the interlayer dielectric layer pattern under vacuum so as to expose the inner side walls of the hole region. A metal deposition prevention layer is formed by oxidizing the metal film in an oxygen atmosphere in an airtight space the pressure of which is maintained below atmospheric pressure. A metal liner is selectively formed at the inner side walls of the exposed hole region. A metal layer is formed within the hole region defined by the metal liner and on the metal deposition prevention layer. The metal layer is reflowed by performing heat-treatment.

The hole region is one of a contact hole exposing one of a source/drain region and a conductive layer of a semiconductor substrate, a via hole, and a groove having a depth smaller than a thickness of the interlayer dielectric layer pattern.

Before the step of forming the metal film, the method for forming a metal wiring layer according to the first aspect of the present invention, may selectively further comprise: the steps of forming a resistant metal layer on the semiconductor substrate on which the interlayer dielectric layer pattern is formed; or forming a barrier metal layer on the resistant metal layer.

Also, the method for forming a metal wiring layer according to the first aspect of the present invention, may further comprise the step of heat-treating the barrier metal layer after the step of forming the barrier metal layer.

The step of forming the metal deposition prevention layer by oxidizing the metal film may be performed in an $O_2$ gas atmosphere or a mixed gas atmosphere of an oxygen-based gas and an inert gas.

The step of heat-treating the barrier metal layer may be performed at a temperature of 400–550° C.

The method for forming a metal wiring layer according to the first aspect of the present invention, may further comprise the step of moving the semiconductor substrate including the metal film into the airtight space between the step of forming the metal film and the step of forming the metal deposition prevention layer. The airtight space is formed in a reaction chamber which is capable of vacuum air exhaustion. Alternatively, the airtight space is formed in a load lock chamber which is installed in a cluster type semiconductor manufacturing apparatus and is capable of vacuum air exhaustion.

The metal liner may be formed by chemical vapor deposition and may be comprised of a monolayer consisting of one metal layer or a double layer consisting of two metal layers.

To achieve the above object of the present invention, there is provided a method for forming a metal wiring layer according to a second aspect of the present invention. A first metal layer is formed to cover predetermined portions of an exposed surface of a semiconductor substrate. A metal deposition prevention layer is formed by oxidizing the first metal layer in an oxygen atmosphere in an airtight space, the pressure of which is maintained below atmospheric pressure. A second metal layer is formed to cover the other portions of the exposed surface of the semiconductor substrate.

The first metal layer may be formed of Al, Ti, or Ta by direct current magnetron sputtering.

The step of forming a metal deposition prevention layer by oxidizing the first metal layer may be performed under an $O_2$ gas atmosphere. The step of forming a metal deposition prevention layer by oxidizing the first metal layer may be performed at an $O_2$ gas partial pressure no greater than 1 Torr. The step of forming a metal deposition prevention layer by oxidizing the first metal layer may be performed at a temperature between room temperature and 200° C.

The step of forming the second metal layer may comprise the step of: forming a metal liner on the other portions of the exposed surface of the semiconductor substrate; and forming a third metal layer, which is planarized, on the metal liner. The third metal layer is formed of one of aluminum and aluminum alloy.

In the method for forming a metal wiring layer filling a contact hole by preferential metal deposition according to the present invention, a metal film is oxidized in an air tight space at a pressure no greater than atmospheric pressure, to form a metal deposition prevention layer. Therefore, the process for oxidizing the metal film can be reproducibly performed. Thus, the processing time can be reduced, and throughput can be enhanced. In addition, a wafer does not have to be exposed in the air, and thus it is possible to prevent the wafer from being contaminated by particles in the air and to minimize the probability of defect occurrence.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF PREFERRED EMBODIMENTS

Figure 1:
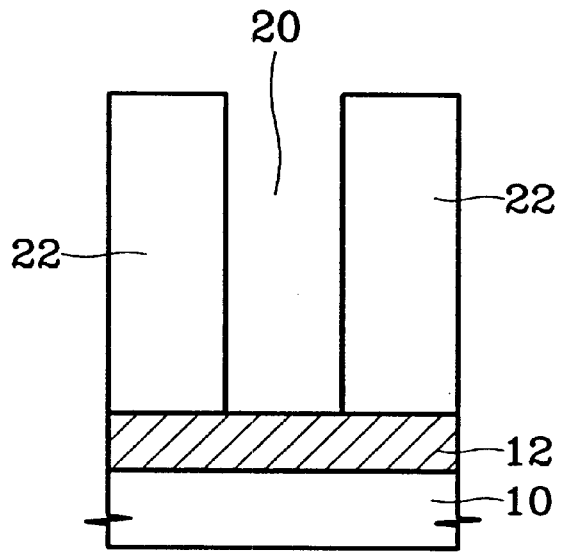
FIGS. 1 through 7 are cross-sectional views illustrating a method for forming a metal wiring layer of a semiconductor device according to an embodiment of the present invention.

The present invention now will be described more fully with reference to the accompanying drawings, in which a preferred embodiment of the invention is shown. The embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate or intervening layers may also be present.

Referring to FIG. 1, an interlayer dielectric layer pattern 22 is formed on a semiconductor substrate 10, on which a conductive region 12 is exposed, so as to define a hole region 20. The interlayer dielectric layer pattern 22 may be formed, for example, of a borophosphosilicate glass (BPSG) layer or an undoped silicon oxide layer.

The conductive region 12 may be a source/drain region or a conductive layer to constitute a transistor on the semiconductor substrate 10, in which case, the hole region constitutes a contact hole. Alternatively, the conductive region 12 may be a metal wiring layer, in which case, the hole region 20 constitutes a via hole. In FIG. 1, the hole region 20 exposes the conductive region 12. The hole region 20, however, may be a groove for forming a damascene wiring layer. In this case, the groove has a depth smaller than a thickness of the interlayer dielectric layer pattern 22, and the groove does not expose the conductive region 12.

Figure 2:
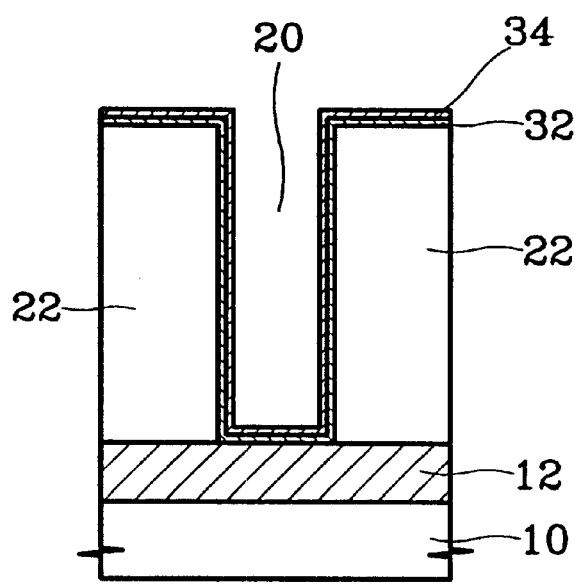

Referring to FIG. 2, a resistant metal layer 32 and a barrier metal layer 34 are sequentially formed on an entire surface of the semiconductor substrate 10, on which the interlayer dielectric layer 22 has been formed. The resistant metal layer 32 is formed of Ti or Ta, preferably, Ti. The barrier metal layer 34 is formed of TiN, TaN, TiAlN, TiSiN, TaAlN, TaSiN, or WN, preferably, TiN.

Next, the barrier metal layer 34 is heat-treated. In a case where the conductive region 12 is a source/drain region formed of an impurity layer, metal atoms in the resistant metal layer 32 react with silicon atoms in the impurity layer, thereby forming a metal silicide layer and obtaining an oxygen stuffing effect in that a grain boundary region of the barrier metal layer 34 is filled with oxygen atoms. As described above, if the barrier metal layer 34 is heat-treated, the metal silicide layer formed between the conductive region 12 and the barrier metal layer 34 can enhance contact resistance and can prevent silicon atoms in the conductive region 12 and aluminum atoms in a metal layer to be formed in a subsequent process from diffusing into each other's layer. In a case where the conductive region 12 constitutes a metal wiring layer, in other words, in a case where the hole region 20 is a via hole exposing the metal wiring layer, the steps for forming the barrier metal layer 34 and heat-treating the barrier metal layer 34 may be omitted. Also, in a case where the hole region 20 constitutes a groove for forming a damascene wiring layer, the same steps may be omitted.

The barrier metal layer 34 is heat-treated in a nitrogen atmosphere at a temperature of about 400–550° C. for about thirty minutes to one hour or by a rapid thermal annealing process performed in an ammonia ($NH_3$) gas atmosphere at a temperature of about 650–850° C. for about thirty seconds to two minutes.

Figure 3:
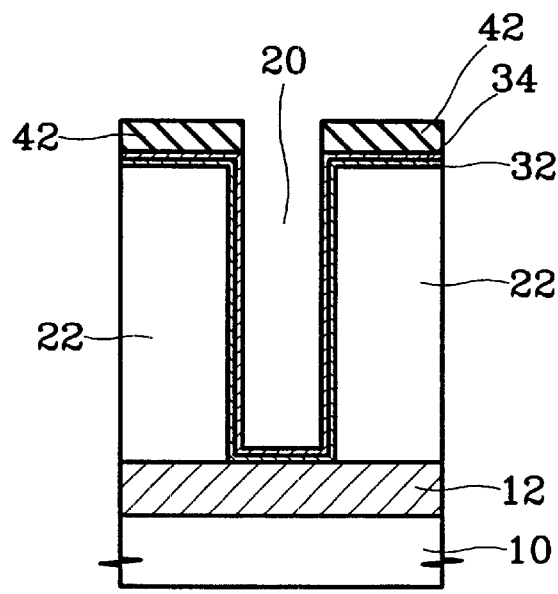

Referring to FIG. 3, a metal film 42 is formed on the barrier metal layer 34 positioned on the top surface of the interlayer dielectric layer pattern 22. The metal film 42 is formed in a vacuum state. Specifically, the metal film 42 is formed to have a thickness of 20–300 Å on the semiconductor substrate including the heat-treated barrier metal layer 34 by physical vapor deposition, such as sputtering. The metal film 42 is formed of a material which is more oxidizable than Si. For example, the metal film 42 may be formed of one of Al, Ti, and Ta. Preferably, a DC magnetron sputter without a collimator is used in the formation of the metal film 42, for example at a pressure of 3–10 mTorr, preferably, 5–10 mTorr, and a low temperature of 10–30° C. In this case, metal atoms sputtered by the DC magnetron sputter start to lose their tendency to move straight, and thus it is possible to prevent the metal film 42 from being formed at the side walls and bottom surface of the hole region 20. Therefore, the metal film 42 is only formed on the top surface of the barrier metal layer 34, and the barrier metal layer 34 is still exposed within the hole region 20.

The metal film 42 may be formed by chemical vapor deposition (CVD). To prevent the metal film 42 from being formed within the hole region 20 in the case of a using the CVD method for forming the metal film 42, it is preferable to maintain a high pressure atmosphere corresponding not to a surface reaction limited region, but, rather, to a mass transported region. For example, in a case where the metal film 42 is formed of an aluminum layer by CVD, the aluminum layer is formed at a temperature of about 180° C. corresponding to the mass transported region of aluminum so that the aluminum layer is not formed within the hole region 20. Since the aspect ratio of the hole region is higher, it is possible to more successfully obtain the desired effect in that the metal film 42 is selectively formed on the top surface of the interlayer dielectric layer pattern 22. In other words, since a contact hole of a highly integrated semiconductor device has a higher aspect ratio, the metal film 42 can be formed on the top surface of the interlayer dielectric layer pattern 22 more effectively.

After that, the semiconductor substrate including the metal film 42 is moved to an airtight space having a pressure lower than atmospheric pressure without breaking the vacuum state maintained in the formation of the metal film 42. The airtight space can be formed by a reaction chamber which is capable of vacuum air exhaustion. In this case, a cluster tool type semiconductor manufacturing apparatus, in which a reaction chamber for forming the metal film 42 and the reaction chamber for preparing the airtight space are equipped together in one device, may be used. In the case of using the cluster tool type semiconductor manufacturing apparatus, the airtight space can be formed by a load lock chamber which is used for moving a wafer in the semiconductor manufacturing apparatus and is capable of vacuum air exhaustion.

Figure 4:
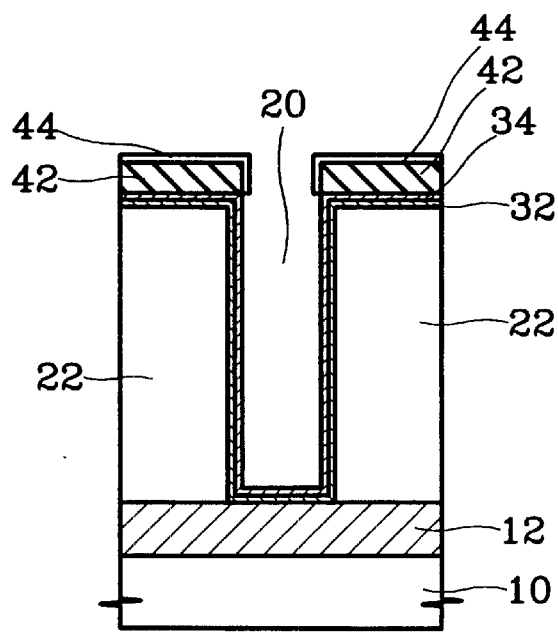

FIG. 4 is a cross-sectional view illustrating a step of oxidizing the metal film 42 in the airtight space. Specifically, the metal film 42 is oxidized in an oxygen atmosphere in the airtight space maintained to have an air pressure lower than the atmospheric pressure, thereby forming a metal deposition prevention layer 44. The metal deposition prevention layer 44 may be formed of $Al_2O_3$, $TiO_2$, or $Ta_2O_5$ depending on the material of the metal film 42. The oxygen atmosphere may be an $O_2$ gas atmosphere or a mixed gas atmosphere of both an oxygen-based gas, such as $O_2$, $O_3$, or $N_2O$, and an inert gas. Preferably, for treatment in an oxygen atmosphere, the temperature of the airtight space is maintained in a range between a room temperature and 200° C., and the partial pressure of $O_2$ gas in the airtight space is no greater than 1 Torr.

When oxidizing the metal film 42, it is possible to form the metal deposition prevention layer 44 by partially oxidizing the metal film 42. To freely adjust the degree to which the metal film 42 is oxidized, the content of oxygen, pressure, temperature, and oxidization time in the airtight space should be controlled. If such oxidization conditions can be controlled, it is possible to reproducibly oxidize the metal film 42. Also, the metal film 42 is oxidized at a relatively low pressure with respect to the atmospheric pressure, thereby reducing the processing time. In addition, it is unnecessary to expose the wafer to atmosphere, and thus it is possible to prevent the wafer from being contaminated by airborne particles, thereby minimizing the probability of defect occurrence.

Figure 5:
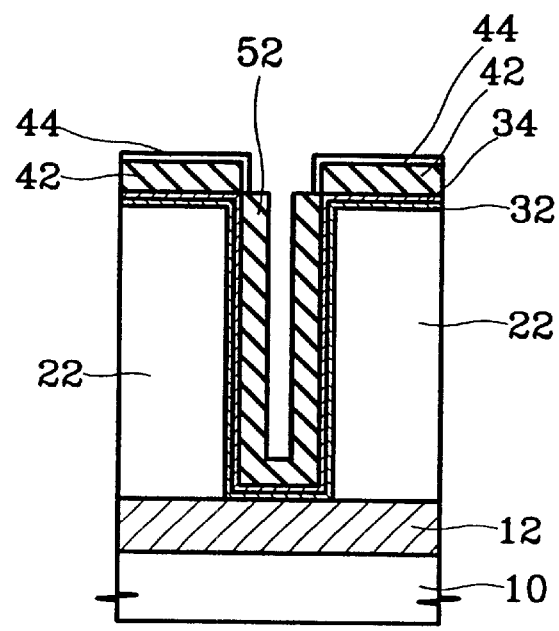

Referring to FIG. 5, a metal liner 52 is formed to have a thickness of about 10–200 Å on the barrier metal layer 34 exposed by the metal deposition prevention layer 44. The metal liner 52 may be formed by a CVD method.

The metal liner 52 may be formed of a single metal layer, such as an aluminum layer. To form the metal liner 52 of a single aluminum layer, a selective metal organic chemical vapor deposition (MOCVD) process may be used. The selective MOCVD process is performed using a precursor formed of an organometallic compound, such as dimethylaluminum hydride (DMAH), trimethylamine alane (TMAA), dimethylethylamine alane (DMEAA), or methylpyrrolidine alane (MPA), as an aluminum source at a deposition temperature of 100–300° C., preferably, 120° C., and a pressure of 0.5–5 Torr, preferably, 1 Torr. Here, to provide the precursor into a CVD chamber, a bubbler, a vapor flow controller, or a liquid delivery system may be used. An inert gas, such as Ar, is used as a dilution gas. To accelerate the decomposition of the precursor, a reaction gas, such as $H_2$ gas, may be added.

The metal liner 52 may be formed of a double layer consisting of two metal layers. For example, the metal liner 52 may be formed of a double layer consisting of a copper layer and an aluminum layer. The copper layer is formed by a selective MOCVD method using $Cu^{1+}$(hfac) TMVS as a metal source. Conditions of the selective MOCVD process for forming the copper layer may be changed depending on the type of underlying layer on which the copper layer will be formed. For example, in a case where the copper layer is formed on the barrier metal layer 34 formed of TiN, the MOCVD process is preferably performed at a pressure of 100 mTorr–10 Torr, preferably, 10 Torr, and a temperature of 150–350° C. If the metal liner 52 is formed to include the copper layer, the electromigrational characteristics of the metal wiring layer can be improved, thereby significantly enhancing the reliability of the metal wiring layer.

Figure 6:
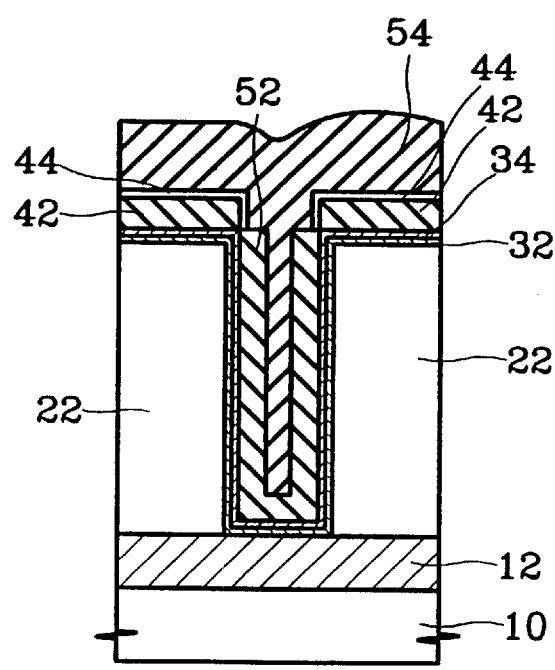

Referring to FIG. 6, a metal layer 54 is formed on the semiconductor substrate so as to completely fill the hole region 20 defined by the metal liner 52. The metal layer 54 is formed by physical vapor deposition. The metal layer 54 is preferably formed of aluminum or an aluminum alloy.

To form the metal layer 54 by using physical vapor deposition, direct current (DC) sputtering, DC magnetron sputtering, alternating current (AC) sputtering, or AC magnetron sputtering may be used. Preferably, the metal layer 54 is formed by DC magnetron sputtering. The step of forming the metal layer 54 is performed using a cluster tool type equipment for maintaining the vacuum state continuing from the step of forming the metal liner 52.

Figure 7:
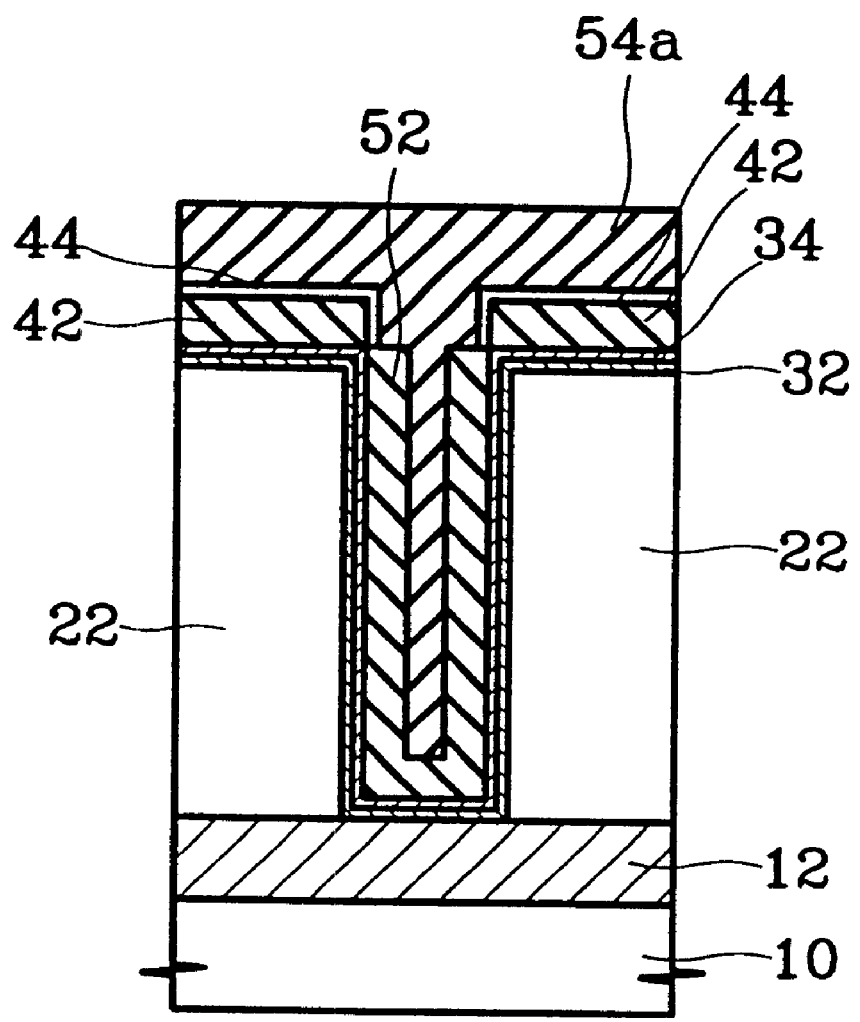

Referring to FIG. 7, the semiconductor substrate in which the metal layer 54 is included is heat-treated and reflowed. For this, the semiconductor substrate is heat-treated in an inert gas atmosphere, for example, using Ar, under vacuum at a temperature of 350–500° C. for several seconds to several minutes, preferably, 30–180 seconds. The heat treatment is preferably carried out in a state where it is difficult to oxidize the surface of the metal layer 54. Thus, the heat-treatment is preferably performed in a highly vacuum state at a pressure no greater than 1 Torr, preferably no greater than $10^{-6}$ Torr.

Under the conditions described above, the metal layer 54 is heat-treated. As a result, a portion of the metal layer 54 moves to pass through the metal liner 52 and mixes with a portion of the metal liner 52. Then, the hole region 20 is completely filled with the metal layer 54, and the top surface 54 is flattened.

In the method for forming a metal wiring layer of the present invention in which a contact hole is filled by physical vapor deposition, a metal film is oxidized in an oxygen atmosphere in an airtight space, the air pressure of which is maintained below atmospheric pressure, thereby forming a metal deposition prevention layer. At this time, the content of oxygen in the airtight space, the pressure and temperature of the airtight space, and the time taken to oxidize the metal film can be controlled in order to adjust the degree to which the metal film is oxidized. Accordingly, the oxidization of the metal film can be reproducibly performed. In addition, the oxidization is performed in the airtight space at a pressure no greater than atmospheric pressure Thus, the processing time can be reduced, and the throughput can be enhanced. There is no need to expose the wafer to atmosphere, and thus it is possible to prevent the wafer from being contaminated by airborne particles in the air, thereby minimizing the probability of the occurrence of defects.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a metal wiring layer comprising the steps of:
    forming an interlayer dielectric layer pattern defining a hole region on a semiconductor substrate;
    forming a metal film on the top surface of the interlayer dielectric layer pattern under vacuum so as to expose inner side walls of the hole region;
    forming a metal deposition prevention layer by oxidizing the metal film in an oxygen atmosphere in an airtight space at a pressure less than atmospheric pressure;
    selectively forming a metal liner at the inner side walls of the exposed hole region;
    forming a metal layer within the hole region defined by the metal liner and on the metal deposition prevention layer; and
    reflowing the metal layer.

2. The method for forming a metal wiring layer of claim 1, wherein the hole region is one of a contact hole, a via hole, and a groove having a depth smaller than a thickness of the interlayer dielectric layer pattern.

3. The method for forming a metal wiring layer of claim 2, wherein the hole region is a contact hole exposing one of a source/drain region and a conductive layer of a semiconductor substrate.

4. The method for forming a metal wiring layer of claim 2, wherein the hole region is a via hole exposing the metal wiring layer of the semiconductor substrate.

5. The method for forming a metal wiring layer of claim 1, further comprising the step of forming a barrier metal layer on the semiconductor substrate, on which the interlayer dielectric layer pattern is formed before the step of forming the metal film.

6. The method for forming a metal wiring layer of claim 5, wherein the barrier metal layer is formed of TiN, TaN, TiAlN, TiSiN, TaAlN, TaSiN, or WN.

7. The method for forming a metal wiring layer of claim 5, further comprising the step of heat-treating the barrier metal layer after the step of forming the barrier metal layer.

8. The method for forming a metal wiring layer of claim 1, further comprising the steps of:
    forming a resistant metal layer on the semiconductor substrate on which the interlayer dielectric layer pattern is formed; and
    forming a barrier metal layer on the resistant metal layer, before the step of forming the metal film.

9. The method for forming a metal wiring layer of claim 8, wherein the resistant metal layer is formed of one of Ti and Ta.

10. The method for forming a metal wiring layer of claim 8, wherein the barrier metal layer is formed of TiN, TaN, TiAlN, TiSiN, TaAlN, TaSiN, or WN.

11. The method for forming a metal wiring layer of claim 8, further comprising the step of heat-treating the barrier metal layer after the step of forming the barrier metal layer.

12. The method for forming a metal wiring layer of claim 11, wherein the step of heat-treating the barrier metal layer is performed at a temperature of 400–550° C.

13. The method for forming a metal wiring layer of claim 11, wherein the step of heat-treating the barrier metal layer is performed by a rapid thermal annealing process.

14. The method for forming a metal wiring layer of claim 13, wherein the rapid thermal annealing process is performed in an ammonia gas atmosphere at a temperature of 650–850° C.

15. The method for forming a metal wiring layer of claim 1, wherein the metal film is formed of Al, Ti, or Ta.

16. The method for forming a metal wiring layer of claim 1, wherein the metal film is formed by direct current magnetron sputtering.

17. The method for forming a metal wiring layer of claim 1, wherein the step of forming a metal deposition prevention layer by oxidizing the metal film is performed in an $O_2$ gas atmosphere.

18. The method for forming a metal wiring layer of claim 17, wherein the step of forming a metal deposition prevention layer by oxidizing the metal film is performed under a condition where the partial pressure of $O_2$ gas is no greater than 1 Torr.

19. The method for forming a metal wiring layer of claim 1, wherein the step of forming a metal deposition prevention layer by oxidizing the metal film is performed at a temperature between room temperature and 200° C.

20. The method for forming a metal wiring layer of claim 1, wherein the step of forming a metal deposition prevention layer by oxidizing the metal film is performed under a mixed gas atmosphere of an oxygen-based gas or inert gas atmosphere.

21. The method for forming a metal wiring layer of claim 20, wherein the oxygen-based gas is $O_2$, $O_3$, or $N_2O$.

22. The method for forming a metal wiring layer of claim 1, further comprising the step of moving the semiconductor substrate including the metal film into the airtight space between the step of forming the metal film and the step of forming the metal deposition prevention layer.

23. The method for forming a metal wiring layer of claim 22, wherein the airtight space is provided in a reaction chamber which is capable of vacuum air exhaustion.

24. The method for forming a metal wiring layer of claim 23, wherein the airtight space is formed in a load lock chamber included in a cluster tool type semiconductor manufacturing apparatus.

25. The method for forming a metal wiring layer of claim 1, wherein the metal liner is formed by chemical vapor deposition.

26. The method for forming a metal wiring layer of claim 1, wherein the metal liner is comprised of a monolayer consisting of one metal layer or a double layer consisting of two metal layers.

27. The method for forming a metal wiring layer of claim 26, wherein the metal liner includes a copper layer or an aluminum layer.

28. The method for forming a metal wiring layer of claim 26, wherein the metal liner is a monolayer consisting of an aluminum layer.

29. The method for forming a metal wiring layer of claim 28, wherein the metal liner is formed by selective metal organic chemical vapor deposition using a precursor of one of dimethylaluminum hydride (DMAH), trimethylamine alane (TMAA), dimethylethylamine alane (DMEAA), and methylpyrrolidine alane (MPA).

30. The method for forming a metal wiring layer of claim 1, wherein the metal liner is formed to have a thickness of 10–200 Å.

31. The method for forming a metal wiring layer of claim 1, wherein the metal layer is formed of one of aluminum and an aluminum alloy.

32. The method for forming a metal wiring layer of claim 1, wherein the metal layer is formed by direct current magnetron sputtering.

33. The method for forming a metal wiring layer of claim 1, wherein the step of heat-treating the semiconductor substrate including the metal layer is performed at a temperature of 350–500° C.

* * * * *